(12) United States Patent
Gordon et al.

(10) Patent No.: US 8,634,226 B2
(45) Date of Patent: Jan. 21, 2014

(54) IMMUNITY OF PHASE CHANGE MATERIAL TO DISTURB IN THE AMORPHOUS PHASE

(75) Inventors: George Gordon, San Jose, CA (US);
Semyon D. Savransky, Newark, CA (US); Ward Parkinson, Boise, ID (US);
Sergey A. Kostylev, Bloomfield Hills, MI (US); James Reed, Rochester Hills, MI (US); Tyler Lowrey, West Augusta, VA (US); Ilya V. Karpov, Santa Clara, CA (US); Gianpaolo Spadini, Campbell, CA (US)

(73) Assignee: Ovonyx, Inc., Sterling Heights, MI (US)

( * ) Notice: Subject to any disclaimer, the term of this patent is extended or adjusted under 35 U.S.C. 154(b) by 130 days.

(21) Appl. No.: 13/158,565

(22) Filed: Jun. 13, 2011

(65) Prior Publication Data

US 2011/0240943 A1    Oct. 6, 2011

Related U.S. Application Data

(62) Division of application No. 12/080,001, filed on Mar. 31, 2008, now Pat. No. 7,990,761.

(51) Int. Cl.
*G11C 11/00* (2006.01)

(52) U.S. Cl.
USPC .............................................. 365/148; 365/163

(58) Field of Classification Search
USPC ................................. 365/148, 163, 157, 174
See application file for complete search history.

(56) References Cited

U.S. PATENT DOCUMENTS

| | | | |
|---|---|---|---|
| 7,254,059 B2* | 8/2007 | Li et al. | 365/185.03 |
| 7,924,600 B2* | 4/2011 | Ho et al. | 365/148 |
| 2007/0114510 A1* | 5/2007 | Sato et al. | 257/5 |
| 2009/0059658 A1* | 3/2009 | Cho et al. | 365/163 |
| 2009/0072218 A1* | 3/2009 | Savransky et al. | 257/4 |
| 2009/0200534 A1* | 8/2009 | Rajendran et al. | 257/3 |
| 2011/0217836 A1* | 9/2011 | Chen et al. | 438/600 |

* cited by examiner

*Primary Examiner* — Vu Le
(74) *Attorney, Agent, or Firm* — Trop, Pruner & Hu, P.C.

(57) ABSTRACT

Disturb from the reset to the set state may be reduced by creating an amorphous phase that is substantially free of crystal nuclei when programming the reset state in a phase change memory. In some embodiments, this can be achieved by using a current or a voltage to program that exceeds the threshold voltage of the phase change memory element, but does not exceed a safe current voltage which would cause a disturb.

5 Claims, 4 Drawing Sheets

IMMUNITY OF PHASE CHANGE MATERIAL TO DISTURB IN THE AMORPHOUS PHASE

CROSS-REFERENCE TO RELATED APPLICATIONS

This application is a divisional of U.S. patent application Ser. No. 12/080,001, filed on Mar. 31, 2008 now U.S. Pat. No. 7,990,761.

BACKGROUND

This relates generally to phase change memories.

A phase change memory is a memory which includes a material that changes between amorphous and crystalline phases. Commonly, such memories include chalcogenide materials.

In some cases, phase change memory states may be detected by determining the threshold voltage of a cell including a phase change material. Depending on the phase of the material, the threshold voltage may change.

One example of a phase change memory that may rely on the threshold voltage of the phase change material is a so-called multilevel cell.

DETAILED DESCRIPTION

In a phase change memory, the amorphous state is sometimes referred to as the reset state and the crystalline state is sometimes referred to as the set state. In a multilevel cell memory, a number of states or levels may be provided, including the reset and set states. Generally, these additional states in a multilevel memory cell are intermediate between set and reset states.

In some cases, where threshold voltages are used to detect the particular state of a level within a multilevel cell, a disturb may result wherein a reset level is inadvertently reprogrammed to a set level in the course of reading the level.

When more than a certain amount of current passes through a phase change memory device in a reset state, its resistance and threshold voltage may change. Thus, it may be appreciated that the act of reading the cell may modify its threshold voltage and thereby change the defining characteristic of the state of a cell or a level within a cell.

Among the undesired results created by this read disturb is that an erroneous write event can happen in the reset state. In a disturb, current through a fully or partially amorphous phase change material exceeds the threshold current or the current that causes a threshold switching event in an amorphous phase change memory cell. A reset state may be sensitive to electrical spikes. For example, the reset state can be disturbed by relatively small current pulses such as noise that may come from reading or writing of adjacent cells, from periphery electrical circuits, from selector elements, from the power supply, or from the environment.

A thermal disturb of a reset state can happen by applying excessive heat or temperature to the chip (high Tj) or during adjacent bit programming in high density arrays. Or, it may be hard to read or verify phase change memory cells using currents above the threshold current of the cell without destruction of the reset state. That is, the reset state may be destroyed in the course of reading or verifying the cell. For example, application to a reset bit of even a modest current at or above Ith may threshold (trigger) the bit to a lower voltage (Vh) with a low dynamic resistance (dv/di). Thereby, the capacitance across the bit is rapidly driven to a lower voltage (Vh) from a the larger Vth at the time of thresholding, which induces substantially greater current in the bit than applied due to capacitance discharge current.

Without being limited to theory, it may be that the reason for these disturb problems is due to the presence of crystal nuclei within the amorphous state. These crystal nuclei are the sites for the growth of the crystalline phase from the amorphous phase. The presence of these crystal nuclei may facilitate the transition from the amorphous to the crystalline phase. This facilitation may result in disturbs or undesired transitions to the set from the reset state.

The disturb problems are exacerbated in situations where, instead of measuring the resistance of the cell in order to detect its state, the cell's threshold voltage is detected. This is because the threshold voltage may be sensitive to a number of extraneous factors, including the amount of current or voltage applied during reading, the way the cell is programmed to the reset state, the amount of time between programming and reading, and the way the cell is read.

In particular, in phase change memory devices where the threshold voltage or threshold current is sensed in order to determine the state of the cell or a cell level, it is then necessary to exceed the threshold voltage of the cell or level in order to detect its state. This may involve higher voltages and currents, such as above Vth and Ith, which may increase the disturb problem. Thus, in some embodiments, it may be necessary to read the cell using voltages or currents above threshold levels but, preferably, below a safe current level. As used herein, a "safe level" is that level for a given cell which does not cause a disturb after a predetermined number of reads. That is, the bit continues to be correctly read in the state intended, and is therefore considered to be undisturbed. Thus, if threshold current is detected, the safe level may be a current and if threshold voltage is being detected, the safe level may be a threshold voltage.

The safe level may be increased, thereby reducing the possibility of disturb and improving the reset immunity to disturb. One way to increase the safe level, be it a current or a voltage, is to use materials which are less prone to being disturbed. Examples of such materials include alloys containing indium, antimony, and tellurium with smaller atomic mobility compared to alloys of germanium, antimony, and tellurium with higher atomic mobilities. A particularly advantageous material (hereinafter "IST") is $In_{22}Sb_{22.5}Te_{55.5}$ or $In_{15}Sb_{28}Te_{57}$.

Another way to improve the safe level is to use more programming energy. The higher energy programming may be implemented using a higher amplitude of programming current or voltage when programming to the reset state than what is conventionally used, by applying the energy for a longer time, by adjusting the slew rate of the applied energy, or by adjusting the pulse width of the applied energy, to mention a few examples.

Thus, in some embodiments, the programming to the reset state may be accomplished so as to create an amorphous phase that is substantially free of crystal nuclei. In some embodiments, less than or equal to about 25 crystal nuclei per hundred square nanometers are present in the amorphous state. This may be achieved, in some embodiments, by applying a higher programming current or voltage. For example, voltages on the order of 0.1 to 20 volts may be used. In one embodiment, currents on the order of 0.05 milliamps to 5 milliamps may be used. Pulse durations of one nanosecond to three microseconds may be used. In some cases, it is desirable to use pulses with abrupt trailing edges. Thus, trailing edge times of 0.001 nanoseconds to 10 microseconds may be used in some embodiments.

Also, in some embodiments, a phase change material is used that forms the crystal phase by crystal growth instead of using a nucleation mechanism. IST is one advantageous material in this regard.

Also, a material with a crystallization energy higher than 2.2 eV may be advantageous. In some embodiments, a crystallization energy may be between 2.2 and 5 eV. Again, IST is an advantageous material in this regard.

The conditions that apply may be specified based on their relationship to that minimum current or voltage needed to change a set to a reset level. Thus, in some embodiments, about 150 percent of the minimum current or voltage needed to transition the material to the reset state (hereinafter "minimum level") may be used for programming a reset level. This 150 percent measure is particularly advantageous in embodiments that use, as the phase change material, indium, antimony, and tellurium glasses. In another embodiment, 200 percent of the minimum current or voltage level may be used. This is particularly advantageous in connection with embodiments that use the so-called germanium selenium, tellurium, or GST 225 alloys, such as GST 225 ($Ge_2Sb_2Te_5$).

In still other embodiments, 250 percent of the minimum level may be utilized. It should be noted that if too high a level of voltage or current is applied to the cell, it may ultimately degrade the cycle life of the cell. However, by maintaining the applied level in an appropriate range, the cycling endurance may be improved. The cycling endurance is the number of reads before a bit loses its memory state. Thus, in some embodiments, it may be desired to avoid exceeding a level such as 350 percent of the minimum level.

In general, a pulse of from 100 to 600 percent of the minimum level may be used. Particularly, with IST about 600 percent may be used.

In some embodiments, the cell may include an ovonic threshold switch as the select device. In other embodiments, it may be a combination of ovonic threshold switch with an ovonic unified memory. In still other embodiments, the memory may be a multilevel cell memory. In general, it may be desired to apply a level of current or voltage that does not create phase segregation.

In general, the problem of reset immunity to disturb is increased in devices that have ovonic threshold switches because of the tendency of ovonic threshold switches to snap back, which could disturb the reset cell.

It may be noted that, in some embodiments, the time to reprogram from the reset to the set state may be increased by reducing the number of crystal nuclei in the reset state.

In multilevel cell memories, the threshold voltage margin may be improved using fixed slew rates. As used herein, the "slew rate" is the rate of increase of current or voltage applied during a read operation, that is by holding consistent the rate of change of the leading edge of the programming pulse—for either current or voltage that is applied for programming. In conventional multilevel cell memories, the slew rate changes depending on the threshold voltage of the level being read. This is done to maintain a constant or fast read access time or to save circuitry, lower cost, or reduce complexity.

However, the threshold voltage itself is affected by the slew rate. (This is also true in phase change memories with or without an ovonic threshold switches.) Therefore, changing the slew rate in the course of reading different levels of a multilevel cell may change the threshold voltage, thereby reducing threshold voltage margin. Thus, in multilevel cell memories, in accordance with some embodiments of the present invention, the same leading edge slew rate is used for each of the multiple levels, regardless of level threshold voltage. Fixing the slew rate across the multilevel cell may improve read margin, in some embodiments, because the read method is not affected by the measured device threshold voltage.

Thus, in some embodiments, multilevel cells having at least two Vth levels are read using slew rates that are the same for both levels. However, the present invention is not limited to any specific number of levels and would apply to any given number of levels of multilevel cell memory.

In accordance with still another embodiment, the threshold voltage read margin may be improved by reading after a fixed time because the threshold voltage varies with time. In particular, the threshold voltage may vary with time since last programming or last reading. Thus, as the threshold voltage changes, in a memory which uses threshold voltage to detect state, errors may arise. The threshold voltage drifts with time and, thus, one can never be sure how long it has been between the last programming operation and the present read operation.

Figure 3:
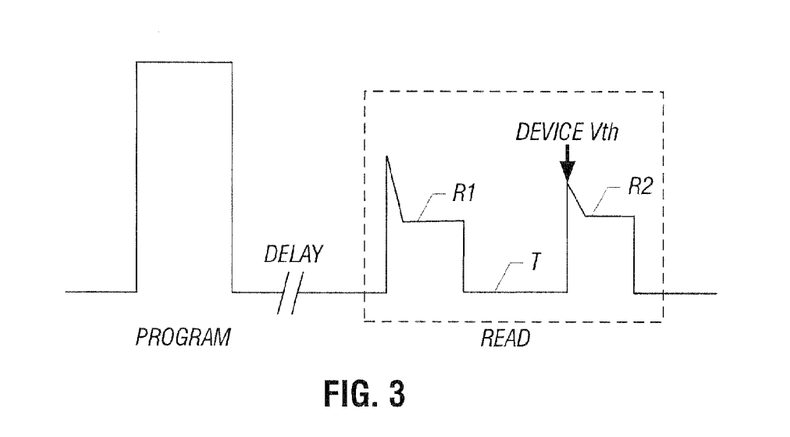
FIG. 3 depicts an exemplary timing diagram for various signals associated with a cell being programmed and read according to an embodiment of the invention.

When it is time to read, a refresh pulse R1 may be issued before the actual read pulse R2 is applied, as indicated in FIG. 3. The refresh pulse may be at a level higher than any level that the device could have drifted to. Thus, in a multilevel cell memory, the refresh pulse amplitude may be equal to the highest possible threshold voltage, together with the maximum drift in some embodiments. Such refresh pulse (R1 in FIG. 3), may have the peak shown that decays directly to ground or, if current is forced, that holds at a lower voltage before being turned off after a pulse width (as shown). Such pulse width may be relatively less than the read pulse width, but should be adequately wide so that Vth during the actual read pulse is adequately consistent for good margin in reading.

Then, it is desirable to wait a given amount of time after the refresh pulse (T) before actually applying the read pulse. In one embodiment, a delay of 100 nanoseconds may be utilized, but the present invention is not so limited. If the circuitry is capable of adequate delay precision repeatedly (such as within 10 percent variation), the time delay may be less, such as 10 nsec, for better read performance. The refresh pulse is not used for any reading purpose and may be otherwise ignored. The read pulses may be a voltage or current pulse that thresholds the device. The device may be an ovonic unified memory, an ovonic unified memory with an ovonic threshold switch, OTS, (e.g., in a field programmable gate array (FPGA)), or a multilevel cell that uses threshold voltage sensing, or another memory element (such as a variable resistor, e.g. RRAM or ionic memory element) in series with an OTS used as a select element. As in the other embodiments, it may be advantageous to avoid exceeding the safe level of the memory element.

The refresh pulse and the read pulse may have the same amplitude in one embodiment. In another embodiment, the read pulse may have an amplitude lower than the refresh pulse.

In accordance with still another embodiment, reset immunity to disturb may be improved by reading a memory cell or level based on threshold voltage using a pair of sequential read pulses. Those pulses are generally higher than the threshold voltage or current of the cell or level and higher than the maximum threshold voltage or current in a multilevel cell plus the highest expected drift.

In some embodiments, a fixed delay may be provided between the refresh pulse and the read pulse. "Fixed delay" means that the same delay is used in all read operations. In one embodiment, this may be modified to eliminate the refresh pulse when reading different levels after the first read operation in a multilevel cell memory.

Figure 1:
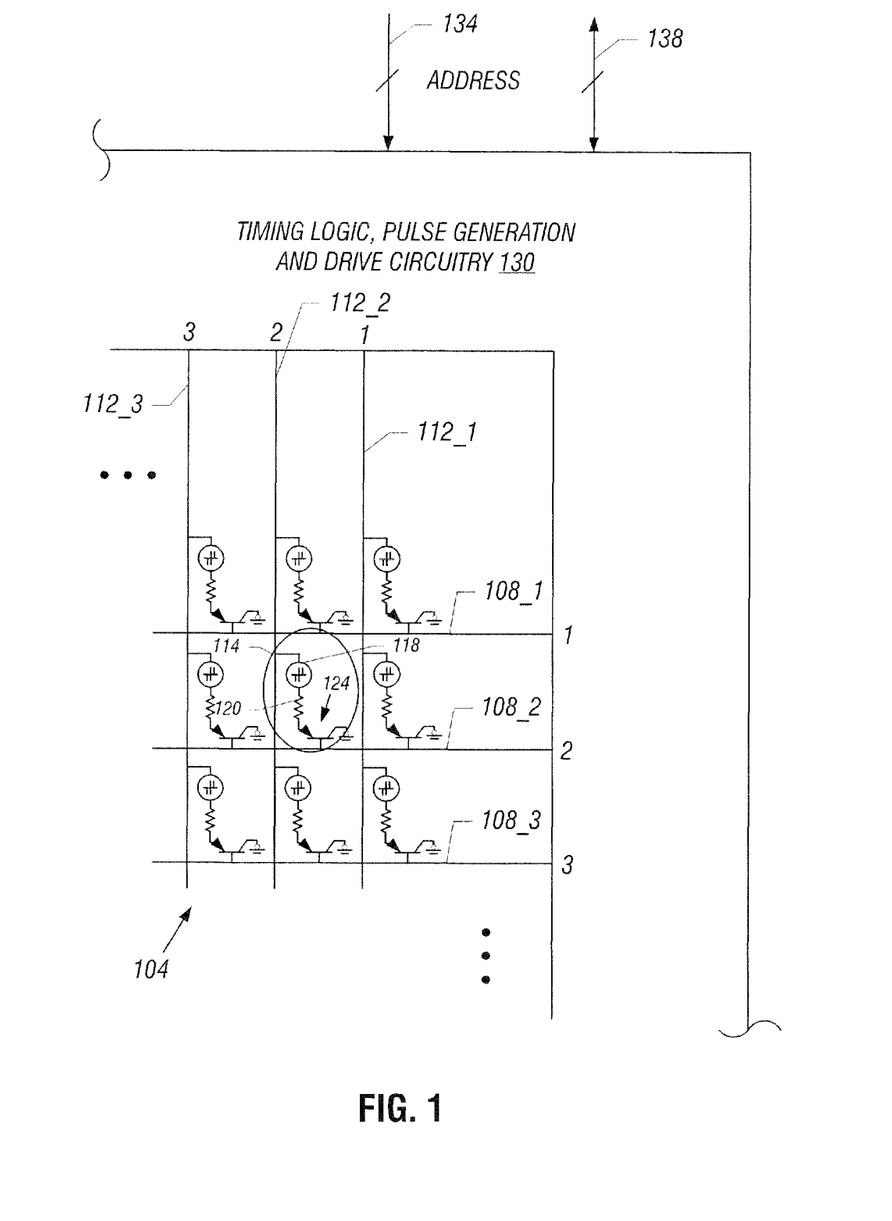
FIG. 1 shows a block diagram of part of an integrated circuit that features a phase change memory array that is coupled to a controller according to an embodiment of the invention.

Referring now to FIG. 1, a phase change memory array 104 is controlled by timing logic, pulse generation and drive circuitry 130. The circuitry 130 is capable of performing programming and read operations on the array 104 according to the various embodiments described. Beginning first with the array 104, a number of vertically oriented conductive lines 112_1, 112_2, . . . , sometimes called bitlines, and a number of horizontally oriented conductive lines 108_1, 108_2, . . . , sometimes called wordlines, may be built on a semiconductor die in a cross-point matrix arrangement as shown. Each crossing of a bitline-wordline pair is associated with a separate memory cell 114. To achieve low manufacturing costs in large volumes, every memory cell 114 in the array 104 may be designed to have the same structure.

Each memory cell 114 has a volume of structural phase change material 118 that is coupled between a separate bitline-wordline pair of the conductive lines 112 and 108. The volume of phase change material 118 stores information for that cell according to its programmed resistivity or threshold voltage. Access to each cell 114 in the embodiment of FIG. 1 is via its corresponding conductive line pair and is made possible through additional circuitry in each cell, namely an isolation (select) device 124 such as a parasitic PNP bipolar transistor, an ovonic threshold switch, or an MOS transistor. The horizontal conductive line for the selected cell, in this case line 108_2, is connected to the base of the transistor 124 while the vertical conductive line 112_2 for the cell 114 is connected to another side of the volume of phase change material 118. In this embodiment, the volume of phase change material 118 is in series with the emitter of the transistor 124, while the collector of the transistor 124 is connected to a power return node that may be a separate power supply or common to all memory cells in the array 104 as well as separate from or common with the timing logic, pulse generation and drive circuitry 130. The transistor 124 connected as shown in FIG. 1 acts as a solid state switch under the control of a wordline signal received at its base. Other configurations for selectively blocking the cell current through the phase change material 118, such as using a discrete switching field effect transistor, diode or ovonic threshold switch (OTS), are also possible. A resistor 120 may also be provided for heating and/or current limiting purposes in series with the volume of phase change material 118.

The cell current may be defined as a current through the volume of phase change material 118, and, in this embodiment, is also the bitline current. The cell current, in this embodiment, is equal to the emitter current of the device 124. The cell memory voltage, on the other hand, may be more loosely defined as any voltage relating to the cell 114 that includes the voltage across the volume of phase change material 118.

Still referring to FIG. 1, the timing logic, pulse generation and drive circuitry 130 has a number of input and output ports where each is coupled to a respective bitline 112 and wordline 108 of the array 104. These ports are driven with appropriate signal levels and timing so that one or more selected cells may be programmed and read as will be seen below. Conventional drive circuitry such as switching transistors may be used together with pulse generation circuitry that allows any desired waveshaping to be achieved on the signals that are driven into the bitlines and wordlines. The timing logic may also be implemented using conventional components including, for instance, counters to impart the needed timing for greater accuracy and speed in the programming and read operations. The timing logic may respond to input requests received via address lines 134 and data lines 138. Such requests may be to, for instance, write a single-bit or multi-bit data value to one or more cells in the array 104. Thus, the circuitry 130 is understood to include any necessary decoding logic to translate the address and data information received on the address and data lines into those bitline-wordline pairs of the array 104 that are to be driven and that correspond to the requested data and address. The circuitry 130 may be formed on the same die as the array 104.

Although the description herein refers to a single selected or target memory cell being programmed and read, the concepts are also applicable to simultaneously program and read from a number of memory cells simultaneously. For instance, depending upon the write request received by the circuitry 130, a number of memory cells that are in the same row of the array and are thus coupled to the same line 108, where each of these cells is coupled to a different column line 112 (vertical line in FIG. 1), may be programmed or read simultaneously.

When a cell 114 has been selected to be either programmed or read, one or more pulses may be applied to the conductive line pairs of the selected cell. Thus, when the cell 114 shown in FIG. 1 is selected to be programmed or read, the potential on the line 112_2 is raised above that of the power return node while the potential on the line 108_2 is lowered (e.g. to that of the power return node) to provide base drive to the transistor 124. This, in turn, allows the emitter current to increase to the levels permitted by the pulse. The voltage and current levels that may be applied to the selected cell for programming and reading will depend on the current-voltage (i.e., I-V) characteristics of the cell.

Figure 2:
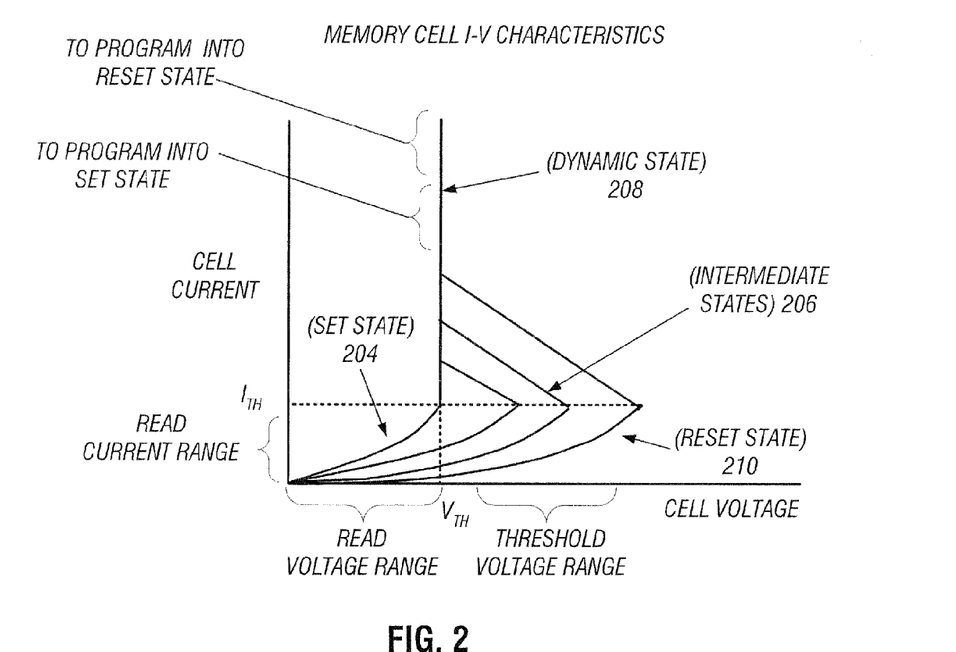
FIG. 2 shows the current voltage characteristics of an exemplary phase change memory cell.

FIG. 2 shows an exemplary set of memory cell I-V characteristics. The figure has been annotated to show various voltage and current levels that may be involved during programming and reading of a phase change memory cell. The change in cell current is shown as a function of cell voltage, for different memory cell states. Note for instance the difference between trace 204 and trace 210. The trace 204 corresponds to the I-V characteristics of a cell that is in the set state. In this state, the phase change material of the cell is predominantly crystalline and therefore presents a low resistance to current. In contrast, when the cell is in the reset state, the phase change material is predominantly amorphous and therefore presents a relatively high resistance to current. The behavior of the cell in the reset state is given by the trace 210. In an embodiment, the cell may be placed into intermediate states such as those that correspond to traces 206 where the phase change material has a structure that is neither predominantly crystalline or predominantly amorphous.

As the cell current rises above a threshold current, $I_{TH}$, the material in the cell may undergo a phase change. The threshold current and voltage ranges described and shown in FIG. 2 are examples of what are referred to here as programming threshold levels. Note however that to actually program the cell into a given state, the cell current may be increased to levels that are indicated in the figure along an essentially vertical trace 208. The trace 208 depicts the dynamic behavior of the cell in which its state may be programmed into the set state, the reset state, or an intermediate state, depending upon the level of cell current reached and the shape and duration of the cell current pulse in an embodiment programmed via current pulses. However, voltage pulses may be used in other embodiments.

In an accordance with an embodiment using a multilevel cell phase change memory, a proposed read and write algorithm is explained in the following discussion.

Starting with the write algorithm, the intermediate state threshold voltages VTH0, VTH1, VTH2, etc. to VTHi to VTHn can be programmed by pulses with different amplitudes. For instance, for a particular realization of a multilevel cell memory, with a two bits per cell architecture, the cell is programmed into four different threshold levels VTH1-VTH3, accorded the binary codes 00, 01, 10, and 11. A pulse for bit 00 can be any known set pulse for a single bit per cell phase change memory and the pulse for bit 11 can be any known reset pulse for a single bit per cell phase change memory. The pulse for a bit 01 may have an amplitude large enough to melt phase change material within a programming volume and may have a trailing edge sharp enough to vitrify the material, such as in the range of 0.1 nsec to 5 nsec. As one example, 800 microamps may be utilized.

The pulse for a bit 10 may have an amplitude larger than for the bit 01, but smaller than for the bit 11 and a sharp trailing edge, for example, in the range of one picosecond to ten nanoseconds.

In one embodiment, square pulses for bits 01, 10, and 11 may be used. Pulse widths for bits 01, 10, and 11 may be long enough to homogenize the melt. For example, the pulse width may be in the range of 100 picoseconds to 500 nanoseconds. The pulse width for bit 00 may be long enough to crystallize phase change material within the programming volume and can have a long trailing edge. For example, the pulse width may be in the range of one nanoseconds to five microseconds and have the trailing edge in the range of 5 nanoseconds to five microseconds.

In accordance with a read embodiment, a relatively high safe current value permits non-destructive reads in some phase change alloys. The usage of an appropriate load ensures that the highest snapback current is smaller than the medium safe current. For example, an appropriate load in one embodiment may be 20 kiloOhms.

Assuming a nominal threshold voltage state for a phase change memory cell programming to two bits per cell, in one embodiment, 00 may correspond to zero volts threshold voltage, 01 may correspond to 2.3 volts threshold voltage, 10 may correspond to 2.8 volts threshold voltage, and 11 may correspond to 3.5 volts threshold voltage. If an ovonic threshold switch is used, some modification may be desirable. The levels described are useful in connection with IST.

Then, the read algorithm, in accordance with one embodiment, may be to force 0.5 volts with current compliance below the safe current for bit 01. If the device is on, that is, if the current is higher than the maximum threshold current, then the state is 00 and the search ends. Otherwise, continue to search for bit state.

Next, force 2.5 volts with current compliance below safe current for bit 10. If the device is on, then the state is 01 and the search ends. Otherwise, continue to search for the bit state.

Next, 3.5 volts may be forced with current compliance below the safe current for bit 1.1. If the device is on, then the state is 10 and end the search. Otherwise, the bit is in the 11 state. You may read above the 11 state to confirm the bit is not an open circuit.

For alloys with high safe currents, such as indium, antimony, and tellurium, it is not necessary to change current compliance at different read steps and a second read algorithm may be used. In the second read algorithm, 0.5 volts may be forced with current compliance below safe current for bit 01. If the device is on, then the state is 00 and the search ends. Otherwise, the search continues.

Then, 2.5 volts may be forced with current compliance below safe current for bit 01. If the device is on, then the state is 01 and the search ends. Otherwise, the search continues.

Then, 3.5 volts may be forced with current compliance below safe current for bit 01. If the device is on, then the state is 10 and the search ends. Otherwise, the bit is in the 11 state. You may read above the 11 state to confirm the bit is not an open circuit. The values of the voltages given are merely illustrative and actual examples may be optimized based on alloy, threshold voltage range, and the slope of the threshold voltage versus current curve.

Because the safe current increases with increased threshold voltage values, lower multilevel cell bits, such as the 01 state in the example given above, for some alloys, may be more susceptible to program disturbs during the read. An alternative read scheme may be to read the resistance of these devices by forcing either voltage or measuring currents or forcing current and measuring voltage for the lower bits 00 and 01 and reading the threshold voltages of these devices for higher bits. Although this would be slower than the read algorithm described above, it does permit the reads to be non-destructive. Because only one of the four memory states uses the resistance measurement technique, total read time may be reduced.

A third read algorithm may include, for example, a double pulse read with the first pulse acting as a refreshing pulse to set the drift and the second pulse used to read the device threshold after a fixed time. Thus, read algorithm 3 may proceed as follows. Initially, 0.5 volts is forced and, if the device is on, then the state is 00. If the device is not on, then a refresh pulse greater than the maximum expected Vth for the cell, accounting for Vth drift, may be applied. Then, the current is measured. If the resistance is greater than 50 kiloOhms, for example, less than 200 kiloOhms, for example, then the state is 01, and the search is ended. Otherwise, a refresh pulse is forced and then the 2.5 read pulse is forced. If the device is on, then the state is 10 and the search ends. Otherwise, the state is 11.

Alternatively, known current force techniques with force current between the threshold current and the safe current may be used similarly to the voltage force algorithms discussed above.

In some phase change memory array cells on the tails of distribution reading above threshold, even for devices with a high safe current, the threshold voltage may degrade over time with repeated reads. To account for this undesired situation, bits may be automatically adjusted as needed using techniques such as error correction code, reference cells, or keeping track of how many times a byte, word, block, or page is read with reprogramming after a certain number of reads. In any of these techniques, reprogramming events can be reduced by employing adaptive read techniques that either reprogram a bit that has been slightly disturbed by the read event or using a countercircuit to calculate how many times the bit as been read. This may save time, energy, and improve device endurance in some cases.

Figure 4:
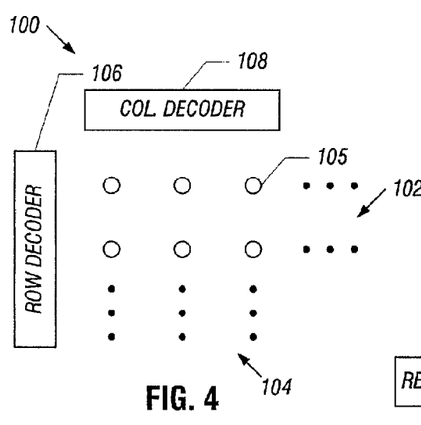
FIG. 4 is a circuit diagram for another embodiment.

In some embodiments, an ovonic threshold switch based field programmable gate array may be utilized. Referring to FIG. 4, a field programmable gate array 100 includes a plurality of ovonic threshold switches 105 arranged in rows 102 and columns 104. The ovonic threshold switches 105 may be addressed by row decoders 106 and column decoders 108.

In some embodiments, error correction circuitry may be used judiciously. Generally, with error correcting circuitry, after being programmed, a bit is verified or read to be sure that it is in the right programmed state. Any time a bit is read and it is not in the correcting programmed state, it is generally reprogrammed. However, sometimes, with certain phase change memories, especially those that are read or detected based on threshold voltage, the threshold voltage may be different every time the device is read.

Figure 5:
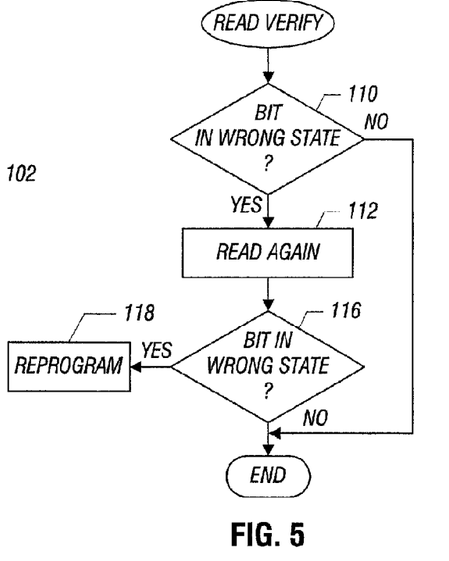
FIG. 5 is a flow chart for one embodiment.

Thus, rather than immediately reprogramming the first time the bit is in the wrong state (FIG. 5, diamond 110), the bit may be read a second time (FIG. 5, block 112). If the bit is then in the correct state after the second read (FIG. 5, diamond 116), no correction is needed. If the bit is still in the wrong state after the second read (FIG. 5, diamond 116), it may then be reprogrammed (FIG. 5, block 118). This may be especially advantageous in materials that are substantially crystal free phase change materials that generate crystals by crystal growth, rather than the nucleation method.

To further improve endurance, the use of FCC write-back at the time of read (RMW) may be avoided in one embodiment. Writing is employed only to write bits requested by a controller and not upon ECC detecting a mis-read (which may be a soft or hard error). Between controller requests for writing to the bit or byte, any errors in the interim may be eliminated by data out correction externally to the array without write back to memory cell after a read (even if that bit or byte required a data correction before transfer to data out or input/output). That is, write-back using ECC may be avoided except during periodic time-outs, such as at power up or upon powering down the computer (or periodically after a time-out, such as every 24 hours or power-on time).

Thereby errors are not overwritten too frequently, at the expense of endurance, nor are they allowed to unreasonably accumulate—preserving a reasonable error rate. The timeout may be variable in duration. For example, the quantity of errors found in scanning the array for write-back may decrease the time-out for the next scan/write-back in proportion to the number of errors detected during the memory scan.

Figure 6:
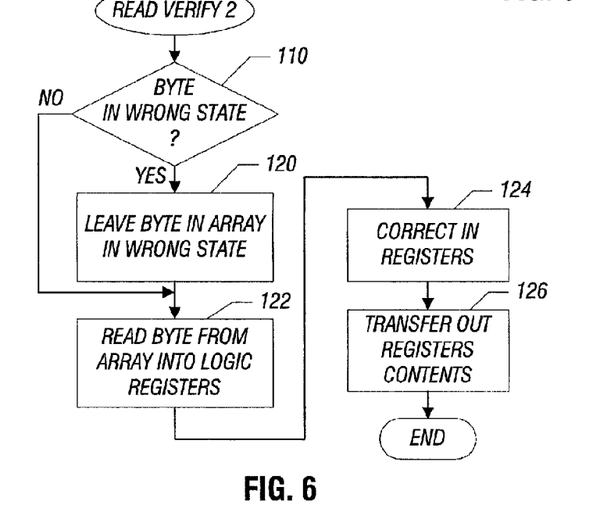
FIG. 6 is a flow chart for another embodiment.

Referring to FIG. 6, in accordance with one embodiment of a read verify operation, a check can then determine if a byte is in the wrong state in diamond 110. The byte is left in the array in the wrong state, as indicated in block 120. The byte may be read from the array, together with error correcting code bits, into logic registers, external to the array, at block 122. If necessary, the byte may be corrected, in the logic registers, to the correct state, as indicated in block 124. Then, the data is transferred out in block 126.

In the alternative, information may be read from the array without storing in a register external to the memory array. For example, the address may be held steady while selected rows and columns access the bits for read necessary for ECC (where the ECC may be on or off chip) and some of all of the bits may come from one or more than one memory chip.

The information from the sense-amps may be rippled through ECC without storing in registers, and if necessary corrected by the logic before presentation at the output. At any point from the memory array to the output pin, the data may be corrected by the ECC, and stored in registers or not, before presenting to the I/O pin for drive to the external bus or for use elsewhere on the chip, such as if the controller or CPU is located on the chip where the memory was accessed. As in the embodiment described above, the information is not written back to array if the command was to only read the information from the array, and is only written to the array upon a Write command from the controller or CPU to improve endurance.

An exception may be, for example, where more than 1 bit in the byte is incorrect. In such an example, the byte may be rewritten at the time of reading. That is, there may be exceptional criteria where the R-M-W algorithm is implemented as is traditionally done with ECC. And again, with this ripple through approach, the array may be scanned upon power up, power down, or after a time-out or some other reasonable criteria, and the bits rewritten where errors are detected. The embodiment is only written periodically during read, not every time or every time where a bit error is detected during read.

As a result, there is no rewriting of incorrect information in the array, which may result in better endurance in some embodiments. A write is thereby avoided during a read unless the byte is ordered to be both read and written in particular.

Figure 7:
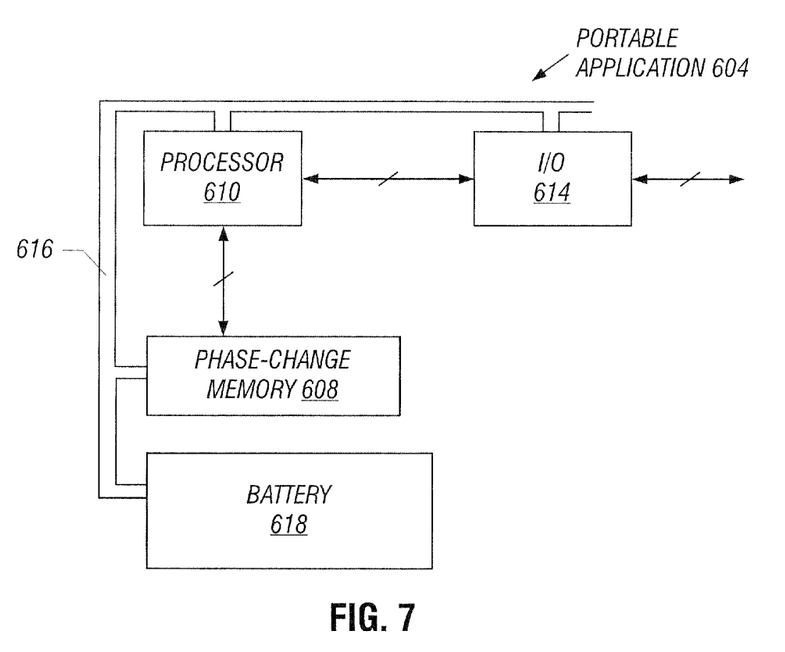
FIG. 7 shows a block diagram of a portable electronic device that embodies a phase change memory IC having the capability of performing a read operation according to an embodiment of the invention.

Turning now to FIG. 7, what is shown is a block diagram of a portable electronic application 604 that embodies a phase change memory storage subsystem 608 having the capability of performing a read operation as has been described above. The storage system 608 may be operated according to an embodiment of the read process described above. The storage system 608 may include one or more integrated circuit dies, where each die has a memory array that is programmed and read according to the embodiments described above. These dice may be separate, stand alone memory devices that are arranged in modules such as conventional dynamic random access memory (DRAM) modules, or they may be integrated with other on-chip functionalities such as part of an I/O processor or a microcontroller.

The application 604 may be for instance a portable notebook computer, a digital still and/or video camera, a personal digital assistant, or a mobile (cellular) hand-held telephone unit. In all of these applications, a processor 610 and the storage system 608 used as program memory to store code and data for execution by the processor have been operatively installed on the board. The portable application 604 communicates with other devices, such as a personal computer or a network of computers, via an I/O interface 614. This I/O interface 614 may provide access to a computer peripheral bus, a high speed digital communication transmission line, or an antenna for unguided transmissions. Communications between the processor and the storage system 608 and between the processor and the I/O interface 614 may be accomplished using conventional computer bus architectures.

The above-described components of the portable application 604 are powered by a battery 618 via a power supply bus 616. Since the application 604 is normally battery powered, its functional components including the storage system 608 should be designed to provide the desired performance at low power consumption levels. In addition, due to the restricted size of portable applications, the components shown in FIG. 6 should provide a relatively high density of functionality. Of course, there are non-portable applications for the storage system 608 that are not shown. These include, for instance, large network servers or other computing devices which may benefit from a non-volatile memory device such as the phase change memory.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
a pair of electrodes; and
a phase change material between said electrodes, said material forming the crystalline phase by crystal growth, wherein said material has a crystallization energy greater than 2.2 eV.

2. The memory of claim 1 wherein said material includes silver, indium, selenium, antimony, and tellurium.

3. The memory of claim 1 wherein said memory is a multilevel cell memory.

4. The memory of claim 1 wherein said memory is read by detecting its threshold voltage.

5. A phase change memory comprising:
a pair of electrodes; and
a phase change material including $Ag_8In_{14}Sb_{55}Te_{23}$ between said electrodes, said material forming the crystalline phase by crystal growth.

* * * * *